US012592674B2

(12) United States Patent
Min et al.

(10) Patent No.: US 12,592,674 B2
(45) Date of Patent: Mar. 31, 2026

(54) SELF-BIAS SIGNAL GENERATING CIRCUIT USING DIFFERENTIAL SIGNAL AND RECEIVER INCLUDING THE SAME

(71) Applicant: Samsung Electronics Co., Ltd., Suwon-si (KR)

(72) Inventors: Kyunghwan Min, Hwaseong-si (KR); Jahoon Jin, Suwon-si (KR); Soomin Lee, Hwaseong-si (KR); Sangho Kim, Suwon-si (KR); Jihoon Lim, Suwon-si (KR); Sodam Ju, Hwaseong-si (KR); Hyunsu Chea, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 626 days.

(21) Appl. No.: 18/058,584

(22) Filed: Nov. 23, 2022

(65) Prior Publication Data

US 2023/0163736 A1 May 25, 2023

(30) Foreign Application Priority Data

Nov. 25, 2021 (KR) ........................ 10-2021-0164881
Jun. 7, 2022 (KR) ........................ 10-2022-0068991

(51) Int. Cl.
*H03F 3/45* (2006.01)

(52) U.S. Cl.
CPC .................... *H03F 3/45179* (2013.01); *H03F 2203/45116* (2013.01); *H03F 2203/45222* (2013.01); *H03F 2203/45601* (2013.01)

(58) Field of Classification Search
CPC ....... H03F 3/45179; H03F 2203/45116; H03F 2203/45222; H03F 2203/45601; H03F 3/4565; H03F 3/45183

(Continued)

(56) References Cited

U.S. PATENT DOCUMENTS 7,319,620 B2    1/2008  Baker
7,924,094 B2 *  4/2011  Sunairi ............... H03F 3/45475
                                                    330/257

(Continued)

FOREIGN PATENT DOCUMENTS

KR         10-1762363 B1      7/2017
KR         10-1837978 B1      3/2018
KR      10-2021-0097355 A     8/2021

OTHER PUBLICATIONS

S. Lee et al. 'A 0.6V 4.266Gb/s/pin LPDDR4X interface with auto-DQS cleaning and write-VWM training for memory controller', *IEEE International Solid-State Circuits Conference*, Session 23 / DRAM, MRAM & DRAM Interfaces / 23.6, 2017, pp. 398-400.

*Primary Examiner* — Andrea Lindgren Baltzell
*Assistant Examiner* — Khiem D Nguyen
(74) *Attorney, Agent, or Firm* — Fish & Richardson P.C.

(57) ABSTRACT

A self-bias signal generating circuit includes a differential amplifier circuit including a current source transistor. The differential amplifier circuit is configured to amplify at least a pair of differential input signals to generate at least a pair of differential output signals, and the differential amplifier circuit is configured to generate an output common-mode signal based on the at least a pair of differential output signals. The self-bias signal generating circuit includes a feedback loop circuit configured to adjust a voltage level of the output common-mode signal to generate a self-bias signal, and the feedback loop circuit is configured to provide the self-bias signal to the differential amplifier circuit. The self-bias signal is applied to a gate terminal of the current source transistor.

20 Claims, 12 Drawing Sheets

(58) Field of Classification Search
USPC ................................................. 330/252–261
See application file for complete search history.

(56) References Cited

U.S. PATENT DOCUMENTS

| | | | |
|---|---|---|---|
| 8,432,185 | B2 | 4/2013 | Scott et al. |
| 8,923,442 | B2 | 12/2014 | Chandrasekaran |
| 9,077,289 | B2 | 7/2015 | Huang et al. |
| 9,773,542 | B2 | 9/2017 | Hollis et al. |
| 10,965,440 | B1 | 3/2021 | Chen et al. |
| 11,062,757 | B1 | 7/2021 | Lee et al. |

\* cited by examiner

FIG. 3

SELF-BIAS SIGNAL GENERATING CIRCUIT USING DIFFERENTIAL SIGNAL AND RECEIVER INCLUDING THE SAME

CROSS-REFERENCE TO RELATED APPLICATIONS

This application claims priority under 35 U.S.C. § 119 to Korean Patent Application No. 10-2021-0164881, filed on Nov. 25, 2021, and Korean Patent Application No. 10-2022-0068991, filed on Jun. 7, 2022, in the Korean Intellectual Property Office, the disclosures of each of which are incorporated by reference herein in their entireties.

FIELD

Some example embodiments of the inventive concepts relate to a self-bias signal generating circuit that generates a self-bias signal by using differential input signals, and/or a receiver including the same.

BACKGROUND

A digital signal classified as 1 and 0 is transmitted in a high-speed wireline interface. However, an actual signal transmitted by a receiving end is in the form of an analog signal with a reduced magnitude due to channel loss and various noise components. To stably convert a received signal into a digital signal through clock sampling, it is desired or necessary to amplify the amplitude of the received signal.

When an analog amplifier is used to amplify the amplitude of a signal, it is desired or necessary to stably set a bias signal for a transistor to operate in a saturated state. However, when a circuit area for generating a bias signal is large, it becomes difficult to implement a highly integrated circuit. Therefore, it is desired or necessary to develop a bias signal generating circuit capable of generating a stable bias signal while reducing or minimizing a circuit area for generating a bias signal.

SUMMARY

Some example embodiments of the inventive concepts provide a self-bias signal generating circuit that generates a stable self-bias signal by using differential input signals and a receiver including the same.

Some example embodiments of the inventive concept also provide a self-bias signal generating circuit that generates a stable self-bias signal while minimizing the increase in a circuit area and a receiver including the same.

According to an aspect of the inventive concepts, a self-bias signal generating circuit includes a differential amplifier circuit including a current source transistor, the differential amplifier circuit configured to amplify at least a pair of differential input signals to generate at least a pair of differential output signals, and the differential amplifier circuit configured to generate an output common-mode signal based on the at least a pair of differential output signals, and a feedback loop circuit configured to adjust a voltage level of the output common-mode signal to generate a self-bias signal, and the feedback loop circuit configured to provide the self-bias signal to the differential amplifier circuit. The self-bias signal is applied to a gate terminal of the current source transistor.

According to another aspect of the inventive concepts, a receiver includes a differential lane circuit including a self-bias signal generating circuit, the differential lane circuit configured to generate a digital differential output signal based on at least a pair of analog differential input signals, and at least one data lane circuit configured to generate a digital data output signal by sampling an analog data input signal. The self-bias signal generating circuit is configured to generate an output common-mode signal based on the at least a pair of analog differential input signals, generate a self-bias signal by adjusting a voltage level of the output common-mode signal, and provide the self-bias signal to the at least one data lane circuit.

According to another aspect of the inventive concepts, a method of generating a self-bias signal includes receiving, by a differential amplifier circuit, at least a pair of differential input signals, generating at least a pair of differential output signals by amplifying the at least a pair of differential input signals, generating an output common-mode signal based on the at least a pair of differential output signals, generating a self-bias signal by adjusting a voltage level of the output common-mode signal, and providing the self-bias signal to the differential amplifier circuit.

BRIEF DESCRIPTION OF THE DRAWINGS

Some example embodiments of the inventive concepts will be more clearly understood from the following detailed description taken in conjunction with the accompanying drawings in which:

FIG. 3 is a circuit diagram showing a self-bias signal generating circuit and a data lane amplifier circuit according to an example embodiment;

DETAILED DESCRIPTION

Figure 1:
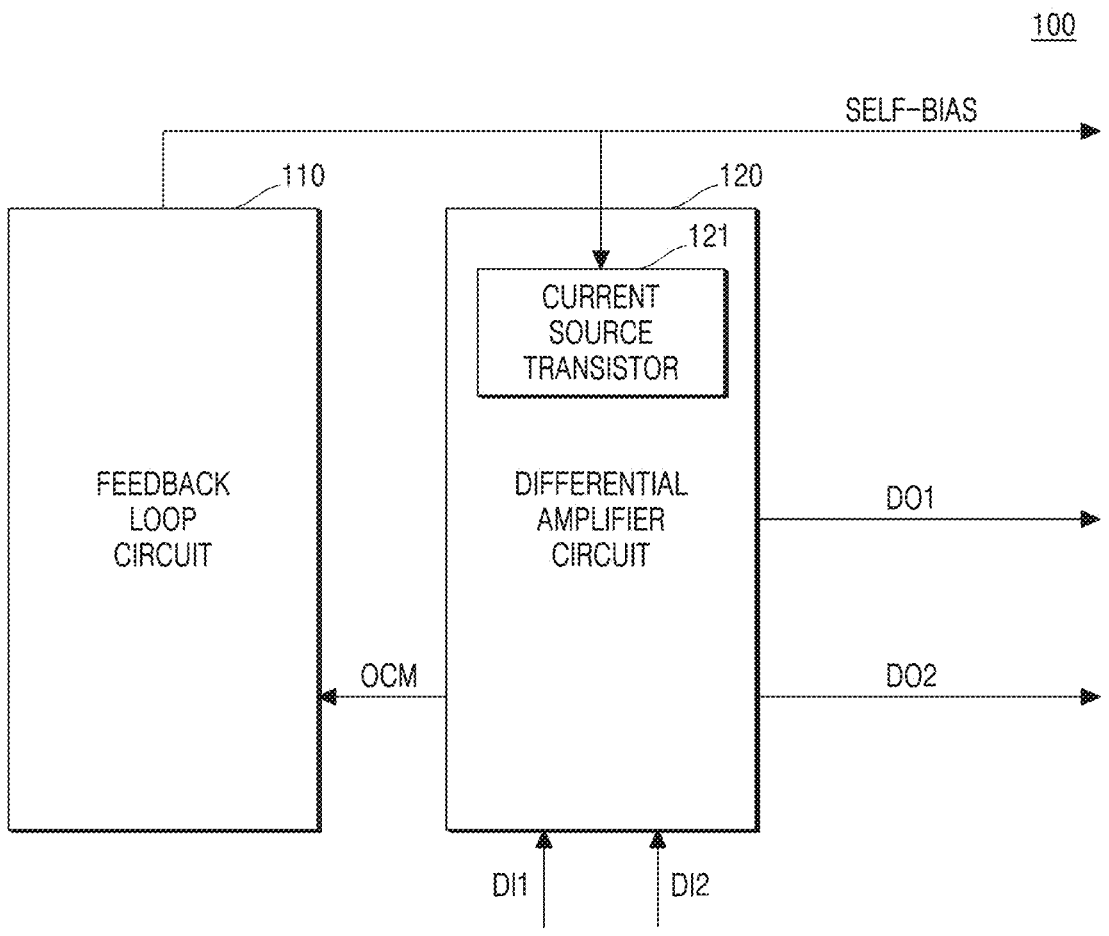
FIG. 1 is a block diagram showing a self-bias signal generating circuit according to an example embodiment.

FIG. 1 is a block diagram showing a self-bias signal generating circuit according to an example embodiment.

Referring to FIG. 1, a self-bias signal generating circuit 100 may generate a self-bias signal SELF-BIAS for a current source transistor 121 by using first and second differential input signals DI1 and DI2. The self-bias signal generating circuit 100 may include a differential amplifier circuit 120 and a feedback loop circuit 110. In some example embodiments of the inventive concepts, the current source transistor 121 may refer to a transistor that generates a current for driving the self-bias signal generating circuit 100. For example, a first PMOS transistor PM1 of FIG. 3 may be the current source transistor 121 of the self-bias signal generating circuit 100.

The self-bias signal SELF-BIAS may refer to a bias signal that is provided to the current source transistor 121 of the differential amplifier circuit 120 by using first and second differential output signals DO1 and DO2 in a differential amplifier without a separate bias signal generating circuit outside the differential amplifier circuit 120.

The differential amplifier circuit 120 may include the current source transistor 121. The differential amplifier circuit 120 may generate at least a pair of differential output signals DO1 and DO2 by amplifying at least a pair of differential input signals DI1 and DI2. The differential amplifier circuit 120 may generate the at least a pair of differential output signals DO1 and DO2 by amplifying the at least a pair of differential input signals DI1 and DI2 to compensate for reduction of signal magnitude due to channel loss and various noise components in a high-speed wired interface. Although FIG. 1 shows the pair of differential input signals DI1 and DI2 and the pair of differential output signals DO1 and DO2, the inventive concepts are not limited thereto, and the differential amplifier circuit 120 may generate two or more pairs of differential output signals by amplifying two or more pairs of differential input signals.

Figure 6:
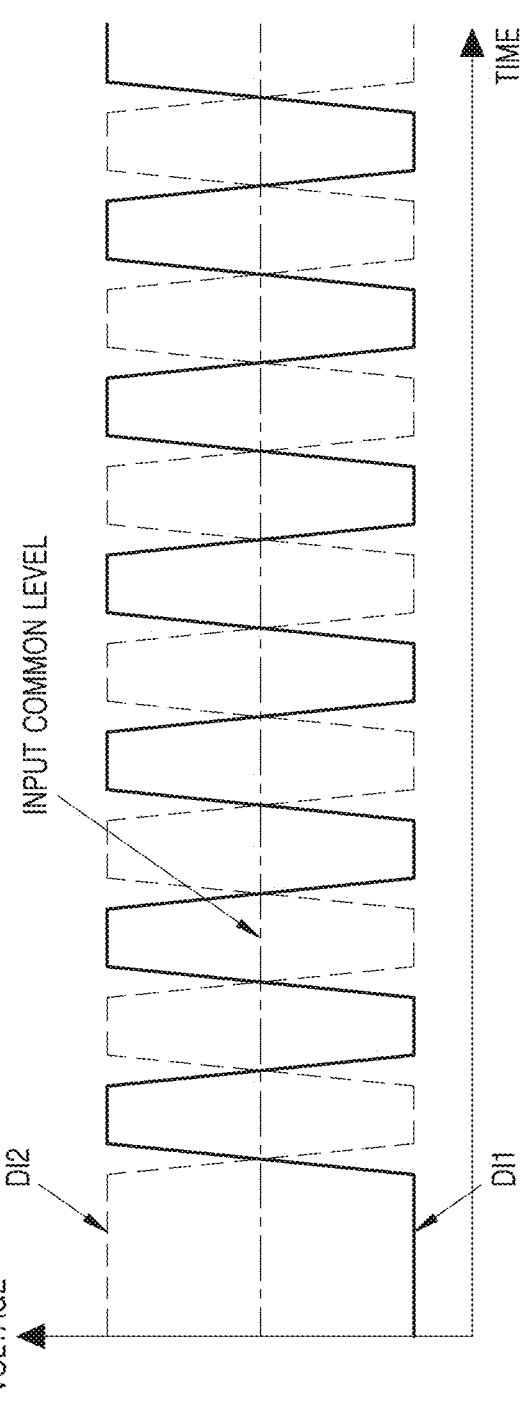
FIG. 6 is a waveform diagram showing voltage levels of differential input signals according to an example embodiment.
Figure 8:
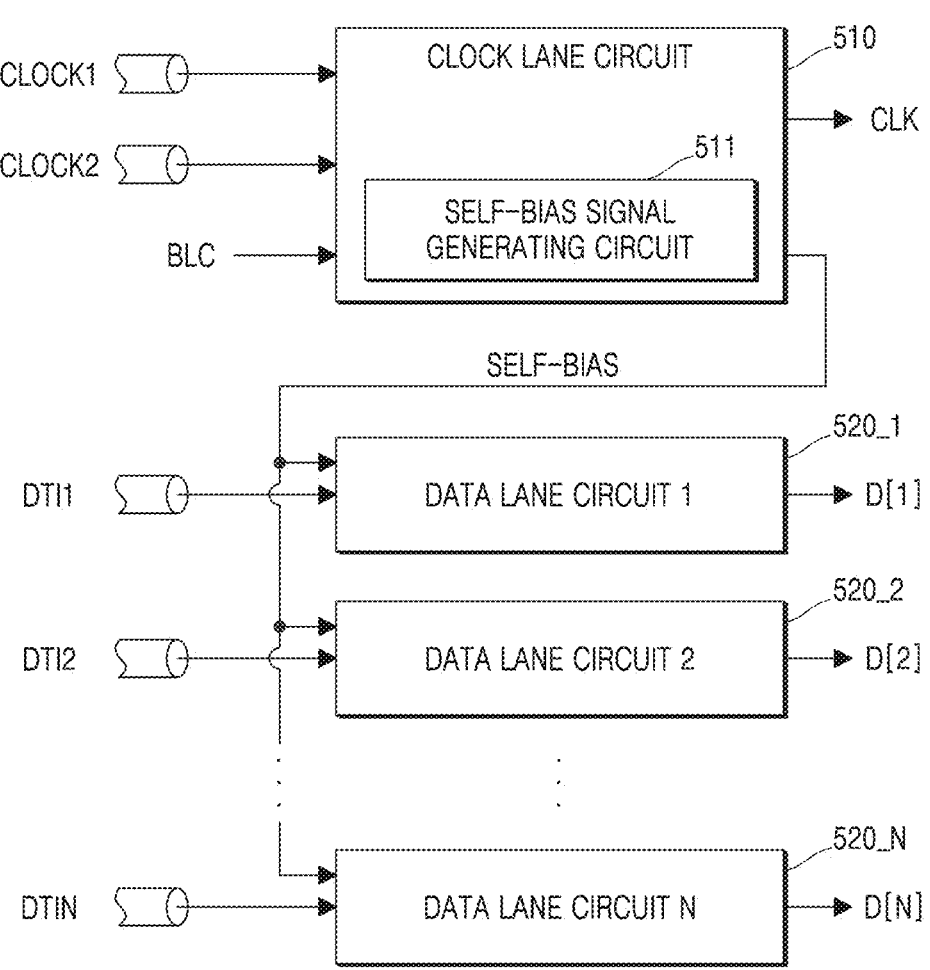
FIG. 8 is a block diagram showing a receiver according to an example embodiment.

The first and second differential input signals DI1 and DI2 and the first and second differential output signals DO1 and DO2 may be signals complementary to each other. For example, the first and second differential input signals DI1 and DI2 may be first and second clock input signals CLOCK1 and CLOCK2 having voltage levels complementary to each other, as shown in FIGS. 6 and 8, and, similarly, the first and second differential output signals DO1 and DO2 may be clock output signals having voltage levels complementary to each other.

The current source transistor 121 may be a transistor that adjusts the level of a current provided to the differential amplifier circuit 120 to amplify the first and second differential input signals DI1 and DI2. The differential amplifier circuit 120 may cause the current source transistor 121 to operate in a saturated state to amplify the magnitudes of the first and second differential input signals DI1 and DI2. For the differential amplifier circuit 120 to stably amplify the first and second differential input signals DI1 and DI2, the level of bias signals applied to a gate terminal of the current source transistor 121 may need to be constant or substantially constant. When the level of a bias signal is changed, the level of a current provided to the differential amplifier circuit 120 may change, and thus the voltage level of the first and second differential output signals DO1 and DO2 output from the differential amplifier circuit 120 may also change.

The differential amplifier circuit 120 may provide an output common-mode signal OCM to the feedback loop circuit 110 based on the first and second differential output signals DO1 and DO2. Here, a common-mode signal may be defined as a signal having an average value of voltages that signals may have. In other words, a common-mode signal may indicate a representative value of signals. For example, an input common-mode signal of the first and second differential input signals DI1 and DI2 may be defined as a signal having an average value of voltages that the first and second differential input signals DI1 and DI2 may have. Similarly, the output common-mode signal OCM of the first and second differential output signals DO1 and DO2 may be defined as a signal having an average value of voltages that the first and second differential output signals DO1 and DO2 may have.

The feedback loop circuit 110 may generate the self-bias signal SELF-BIAS by adjusting the voltage level of the output common-mode signal OCM received from the differential amplifier circuit 120. As described below with respect to FIG. 3, the feedback loop circuit 110 may adjust the voltage level of the output common-mode signal OCM by using a loop amplifier circuit L_AMP, etc.

The feedback loop circuit 110 may provide the generated self-bias signal SELF-BIAS to the differential amplifier circuit 120. Also, the feedback loop circuit 110 may provide the self-bias signal SELF-BIAS to a circuit that desires or needs a stable bias signal, e.g., a data lane circuit. For example, as described later with reference to FIG. 8, a self-bias signal generating circuit 511 may provide the self-bias signal SELF-BIAS generated through a feedback loop circuit to a circuit that needs a stable bias signal, e.g., data lane circuits 520_1 to 520_N.

Figure 2:
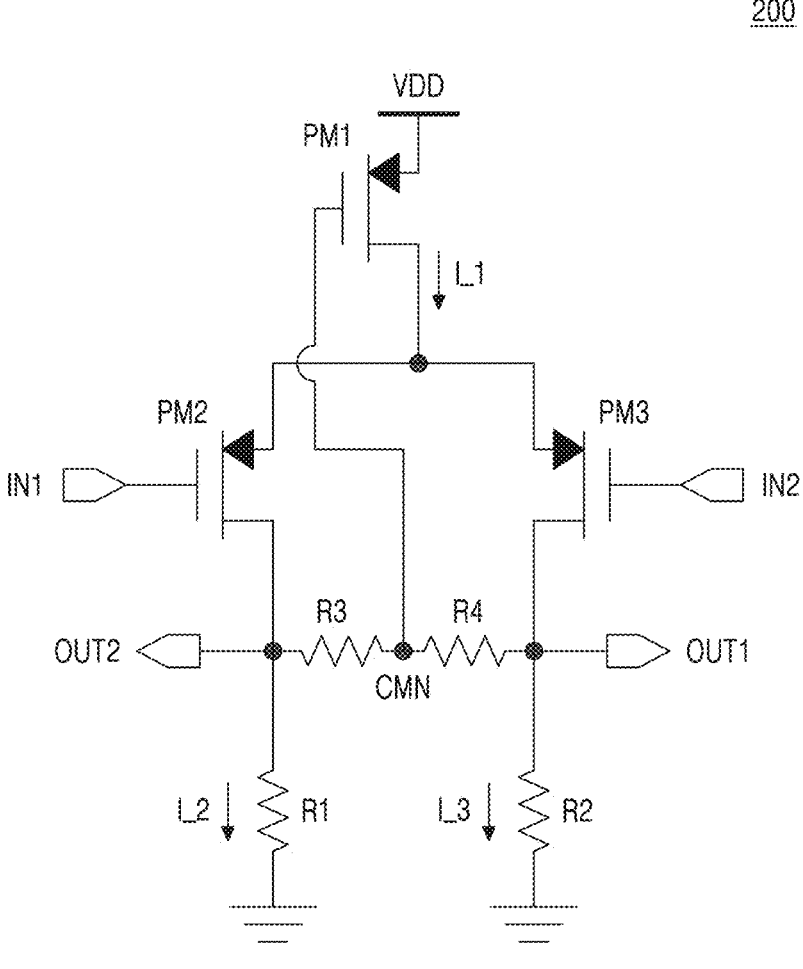
FIG. 2 is a circuit diagram showing a self-bias signal generating circuit according to a comparative example embodiment.

FIG. 2 is a circuit diagram showing a self-bias signal generating circuit according to a comparative example embodiment. Referring to FIG. 2, a self-bias signal generating circuit 200 according to a comparative example embodiment may include first to third PMOS transistors PM1 to PM3 and first to fourth resistors R1 to R4.

A power voltage VDD may be applied to a source of the first PMOS transistor PM1. A gate of a second PMOS transistor PM2 may be connected to a first input terminal to which a first differential input signal DI1 is applied, and a source of the second PMOS transistor PM2 may be connected to a drain of the first PMOS transistor PM1. A gate of a third PMOS transistor PM3 may be connected to a second input terminal to which a second differential input signal DI2 is applied, and a source of the third PMOS transistor PM3 may be connected to the drain of the first PMOS transistor PM1.

A first end of a first resistor R1 may be connected to a ground terminal, and a second end of the first resistor R1 may be connected to a drain of the second PMOS transistor PM2. A first end of a second resistor R2 may be connected to a ground terminal, and a second end of the second resistor R2 may be connected to a drain of the third PMOS transistor PM3. A first end of a third resistor R3 may be connected to the second end of the first resistor R1 and a second output terminal to which a second differential output signal DO2 is applied, and a second end of the third resistor R3 may be connected to a gate of the first PMOS transistor PM1. A first end of a fourth resistor R4 may be connected to a second end of the third resistor R3, and a second end of the fourth resistor R4 may be connected to a first output terminal to which a first differential output signal DO1 is applied and the second end of the second resistor R2.

The first PMOS transistor PM1 may operate as a current source transistor of the self-bias signal generating circuit 200. The gate of the first PMOS transistor PM1 may be turned on by receiving the output common-mode signal OCM from a common-mode node CMN. The source of the first PMOS transistor PM1 may be connected to a power terminal to which the power voltage VDD is applied. The first PMOS transistor PM1 may generate a first current Ii for driving the self-bias signal generating circuit 200 and provide the first current Ii to the second PMOS transistor PM2 and the third PMOS transistor PM3.

A gate of the second PMOS transistor PM2 may receive a first input signal IN_1, and thus the second PMOS transistor PM2 may be turned on. A gate of the third PMOS transistor PM3 may receive a second input signal IN_2, and thus the third PMOS transistor PM3 may be turned on. However, when the voltage level of the first input signal IN_1 or the second input signal IN_2 is randomly changed, a degree to which a channel of the second PMOS transistor PM2 or a third PMOS transistor PM3 is formed may also be randomly changed. For example, when the first input signal IN_1 is a data input signal having a random voltage level, the degree to which a channel of the second PMOS transistor PM2 is formed may be randomly changed.

The first resistor R1 and the second resistor R2 may be smaller in magnitude than the third resistor R3 and the fourth resistor R4. Therefore, the magnitude of a current flowing through the third resistor R3 and the fourth resistor R4 may be negligibly small as compared to a current flowing through the first resistor R1 and the second resistor R2. Therefore, the sum of the magnitude of a second current I_2 flowing through the first resistor R1 and the magnitude of a third current I_3 flowing through the second resistor R2 may be equal or substantially equal to the magnitude of the first current Ii flowing through the first PMOS transistor PM1.

The voltage level of a second output signal OUT2 may be R1*I_2 which is a value obtained by multiplying the magnitude of the first resistor R1 by the second current I_2, and the voltage level of a first output signal OUT1 may be R2*I_3, which is a value obtained by multiplying the magnitude of the second resistor R2 by the third current I_3. When the third resistor R3 and the fourth resistor R4 have the same or substantially the same magnitude, the voltage level of the output common-mode signal OCM applied to the common-mode node CMN may be $$\frac{R1 * I\_2 + R2 * I\_3}{2},$$

which is the average of R1*I_2 and R2*I_3. Therefore, the voltage level of the output common-mode signal OCM may be influenced by the magnitudes of the second current I_2 and the third current I_3.

When the voltage level of the first input signal IN_1 or the second input signal IN_2 is randomly changed, a degree to which a channel of the second PMOS transistor PM2 or the third PMOS transistor PM3 is formed may also be randomly changed. Therefore, the magnitudes of the second current I_2 and the third current I_3 may also be randomly changed, and the voltage level of the output common-mode signal OCM may also be randomly changed. When the magnitudes of the second current I_2 and the third current I_3 are randomly changed, the voltage levels of the first output signal OUT1 and the second output signal OUT2 may also be randomly changed, the sizes of eyes of the first output signal OUT1 and the second output signal OUT2 may be reduced.

When the voltage level of the output common-mode signal OCM is randomly changed, the level of a voltage applied to the gate of the first PMOS transistor PM1 may also be randomly changed, and thus the magnitude of the first current I_1 may also be randomly changed. Therefore, since the voltage level of a bias signal (e.g., the output common-mode signal OCM) applied to the first PMOS transistor PM1 according to the first input signal IN_1 and the second input signal IN_2 is changed, it may be difficult for the self-bias signal generating circuit 200 shown in FIG. 2 to generate stable bias signals.

Also, since the self-bias signal generating circuit 200 is unable to adjust the voltage level of the output common-mode signal OCM, the level of a bias voltage applied to the gate of the first PMOS transistor PM1 may not be adjusted.

Figure 3:
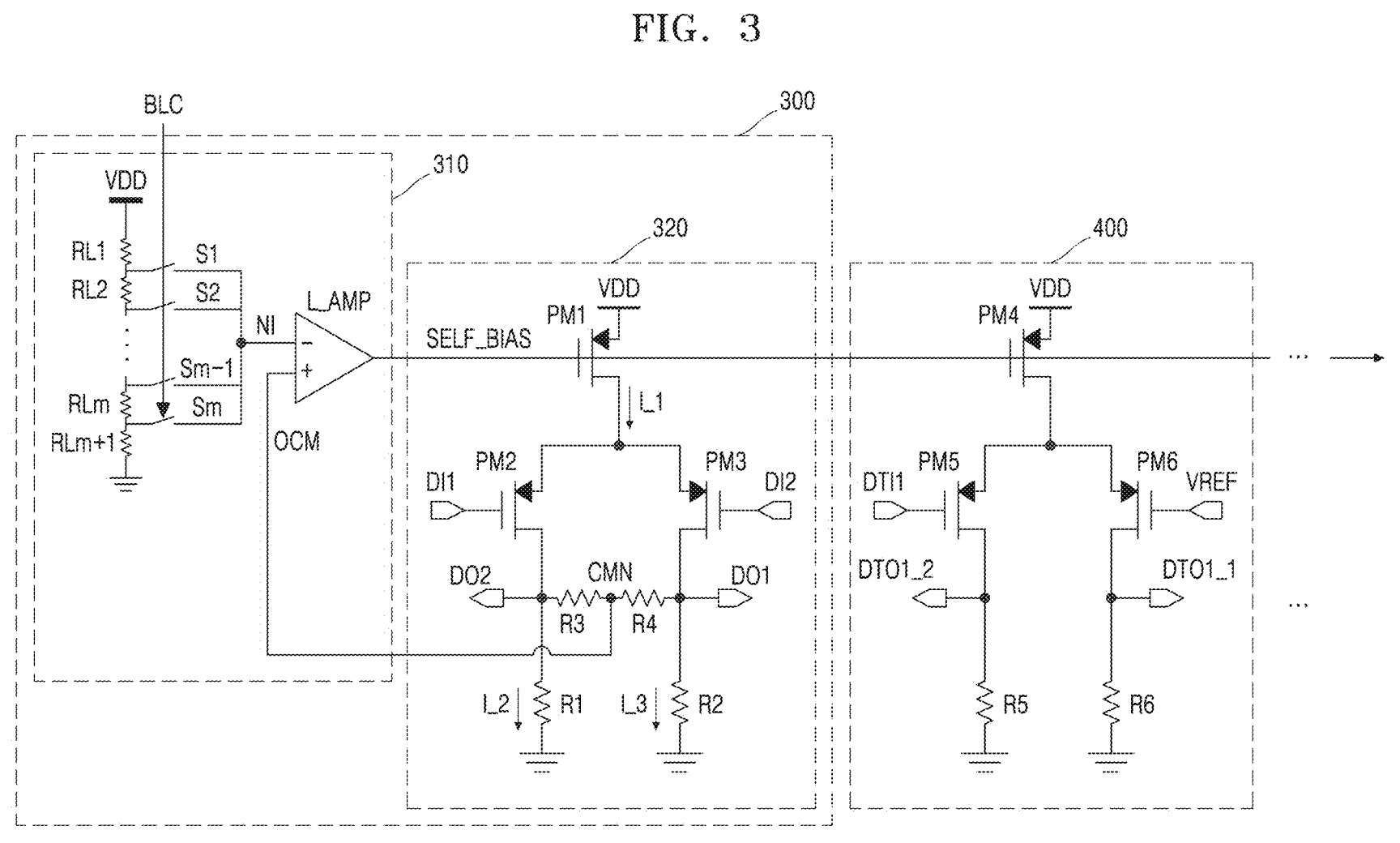

FIG. 3 is a circuit diagram showing a self-bias signal generating circuit and a data lane amplifier circuit according to an example embodiment.

Referring to FIG. 3, a self-bias signal generating circuit 300 according to an example embodiment may include a feedback loop circuit 310 and a differential amplifier circuit 320.

The differential amplifier circuit 320 may include the first to third PMOS transistors PM1 to PM3 and the first to fourth resistors R1 to R4.

The source of the first PMOS transistor PM1 may be connected to a power electrode to which the power voltage VDD is applied. A gate of a second PMOS transistor PM2 may be connected to a first input terminal to which a first differential input signal DI1 is applied, and a source of the second PMOS transistor PM2 may be connected to a drain of the first PMOS transistor PM1. A gate of a third PMOS transistor PM3 may be connected to a second input terminal to which a second differential input signal DI2 is applied, and a source of the third PMOS transistor PM3 may be connected to the drain of the first PMOS transistor PM1.

A first end of a first resistor R1 may be connected to a ground terminal, and a second end of the first resistor R1 may be connected to a drain of the second PMOS transistor PM2. A first end of a second resistor R2 may be connected to a ground terminal, and a second end of the second resistor R2 may be connected to a drain of the third PMOS transistor PM3. A first end of the third resistor R3 may be connected to a second other end of the first resistor R1 and a second output terminal, and a second end of the third resistor R3 may be connected to a positive input terminal of the loop amplifier circuit L_AMP. A first end of a fourth resistor R4 may be connected to a second end of the third resistor R3, and a second end of the fourth resistor R4 may be connected to a first output terminal and the second end of the second resistor R2.

The first PMOS transistor PM1 may operate as a current source transistor of the self-bias signal generating circuit 300. The gate of the first PMOS transistor PM1 may be turned on by receiving the self-bias signal SELF-BIAS from the feedback loop circuit 310. The source of the first PMOS transistor PM1 may be connected to a power terminal. The first PMOS transistor PM1 may generate a first current I_1 for driving the self-bias signal generating circuit 300 and provide the first current I_1 to the second PMOS transistor PM2 and the third PMOS transistor PM3.

A gate of the second PMOS transistor PM2 may receive the first differential input signal DI1, and thus the second PMOS transistor PM2 may be turned on. A gate of the third PMOS transistor PM3 may receive the second differential input signal DI2, and thus the third PMOS transistor PM3 may be turned on. Here, the first differential input signal DI1 and the second differential input signal DI2 may be input signals that form a pair in a complementary relationship with each other. In other words, the sum of the first differential input signal DI1 and the second differential input signal DI2 may have a constant or substantially constant voltage level. Therefore, an input common-mode signal of the differential amplifier circuit 320, which corresponds to the average value of the first differential input signal DI1 and the second differential input signal DI2, may have a constant voltage level.

The first resistor R1 and the second resistor R2 may be smaller in magnitude than the third resistor R3 and the fourth resistor R4. Therefore, the magnitude of a current flowing through the third resistor R3 and the fourth resistor R4 may be negligibly small as compared to a current flowing through the first resistor R1 and the second resistor R2. Therefore, the sum of the magnitude of a second current I_2 flowing through the first resistor R1 and the magnitude of a third current I_3 flowing through the second resistor R2 may be equal or substantially equal to the magnitude of the first current I_1 flowing through the first PMOS transistor PM1.

The voltage level of the second differential output signal DO2 may be R1*I_2 which is a value obtained by multiplying the magnitude of the first resistor R1 by the second current I_2, and the voltage level of the first differential output signal DO1 may be R2*I_3, which is a value obtained by multiplying the magnitude of the second resistor R2 by the third current I_3. When the third resistor R3 and the fourth resistor R4 have the same magnitude, the voltage level of the output common-mode signal OCM applied to the common-mode node CMN may be $$\frac{R1*I\_2 + R2*I\_3}{2}$$

which is the average of R1*I_2 and R2*I_3. Therefore, the voltage level of the output common-mode signal OCM may be influenced by the magnitudes of the second current I_2 and the third current I_3.

Referring to FIG. 6, since the input common-mode signal of the differential amplifier circuit 320 may have a constant or substantially constant voltage level, the output common-mode signal OCM, which corresponds to the average value of the first differential output signal DO1 and the second differential output signal DO2, may also have a constant or substantially constant voltage level.

As the output common-mode signal OCM may be transmitted to the positive input terminal of the feedback loop circuit 310, the voltage level of the output common-mode signal OCM may be adjusted, and the self-bias signal SELF-BIAS may be generated from the feedback loop circuit 310.

Since the self-bias signal SELF-BIAS may have a constant or substantially constant voltage level, the magnitude of the first current I_1 flowing through the first PMOS transistor PM1, which is the current source transistor of the differential amplifier circuit 320, may be constant or substantially constant. Therefore, the sum of the second current I_2 and the third current I_3 may also be constant or substantially constant.

The feedback loop circuit 310 may include first to m-th switches S1 to Sm, first to m+1-th loop resistors RC1 to RCm+1, and the loop amplifier circuit L_AMP.

The first to m-th switches S1 to Sm may each be implemented by an electronic device like a metal oxide semiconductor field-effect transistor (MOSFET), a bi-polar junction transistor (BJT), and an insulated gate bipolar transistor (IGBT), but example embodiments are not limited thereto.

The first to m+1-th loop resistors RL1 to RLm+1 may be connected in series between a power terminal and a ground terminal, a voltage of $$\frac{1}{m+1}*VDD$$

8 may be applied to the series-connected first to m+1-th loop resistors RL1 to RLm+1.

The feedback loop circuit 310 may adjust the voltage level of a negative input signal NI applied to a negative input terminal of the loop amplifier circuit L_AMP based on a bias level control signal BLC received from a controller (not shown). The feedback loop circuit 310 may adjust the voltage level of the negative input signal NI by adjusting turn-on/turn-off of the first to m-th switches S1 to Sm based on the bias level control signal BLC. For example, the bias level control signal BLC may have information for turning on a first switch S1 and an m−1-th switch Sm−1 and turning off second to m−2-th switches S2 to Sm−2 and an m-th switch Sm. The feedback loop circuit 310 may turn on the first switch S1 and the m−1-th switch Sm−1 and turn off the other switches, based on the bias level control signal BLC. Therefore, a voltage of $$\frac{m-2}{m+1}*VDD,$$

which is a voltage applied to m−2 resistors (e.g., RC2 to RCm−1) between the first switch S1 and the m−1-th switch Sm−1, may be applied to the negative input terminal.

According to some example embodiments, the loop amplifier circuit L_AMP may be one of various amplifier circuits like a non-inverting amplifier circuit, an inverting amplifier circuit, an addition inverting amplifier circuit, and an addition non-inverting amplifier circuit, but example embodiments are not limited thereto. For example, when the loop amplifier circuit L_AMP is a non-inverting amplifier circuit, the loop amplifier circuit L_AMP may generate the self-bias signal SELF-BIAS having a value obtained by subtracting a voltage applied to the negative input terminal from a voltage applied to the positive input terminal and multiplying a result of the subtraction by the gain of the loop amplifier circuit L_AMP. The feedback loop circuit 310 may provide the self-bias signal SELF-BIAS to the gate of the first PMOS transistor PM1 of the differential amplifier circuit 320 and a gate of a fourth PMOS transistor PM4 of a data lane amplifier circuit 400.

Although FIG. 3 shows that the feedback loop circuit 310 generates the negative input signal NI by using the first to m+1-th loop resistors RL1 to RLm+1 and the first to m-th switches S1 to Sm, the feedback loop circuit 310 may also generate the negative input signal NI by using a separate voltage generator.

Since the self-bias signal generating circuit 300 generates the self-bias signal SELF-BIAS by using the output common-mode signal OCM having a constant or substantially constant voltage level, the self-bias signal generating circuit 300 may generate a stable self-bias signal SELF-BIAS by using the first and second differential input signals DI1 and DI2 even when process, voltage, and temperature (PVT) changes occur.

The data lane amplifier circuit 400 may include fourth to sixth PMOS transistors PM4, PM5 and PM6, a fifth resistor R5, and a sixth resistor R6. The data lane amplifier circuit 400 may be a circuit included in the data lane circuits 520_1 to 520_N, which will be described later with reference to FIG. 8. The data lane amplifier circuit 400 may receive a first input data signal DTI1 in a single ended mode. Here, the single ended mode may refer to a mode in which a data signal is transmitted through a single wire.

In some example embodiments, the self-bias signal generating circuit 300 and the data lane amplifier circuit 400 may be components of a source synchronous interface receiver. In other words, the first and second differential input signals DI1 and DI2 applied to the self-bias signal generating circuit 300 and the first input data signal DTI1 applied to the data lane amplifier circuit 400 may be simultaneously transmitted in parallel.

The data lane amplifier circuit 400 may generate an output data signal 1_1 DTO1_1 and an output data signal 1_2 DTO1_2 based on the first input data signal DTI1 and a reference voltage signal VREF received from a reference voltage generating circuit (not shown) in the receiver. As shown in FIG. 8, the output data signal 1_1 DTO1_1 and the output data signal 1_2 DTO1_2 may be sampled a first data lane circuit 520_1 and converted into a first digital data signal D[1], as shown in FIG. 8.

Although one data lane amplifier circuit 400 is shown in FIG. 3, there may be N data lane amplifier circuits 400 depending on the receiver (where N is a natural number).

Figure 4A:
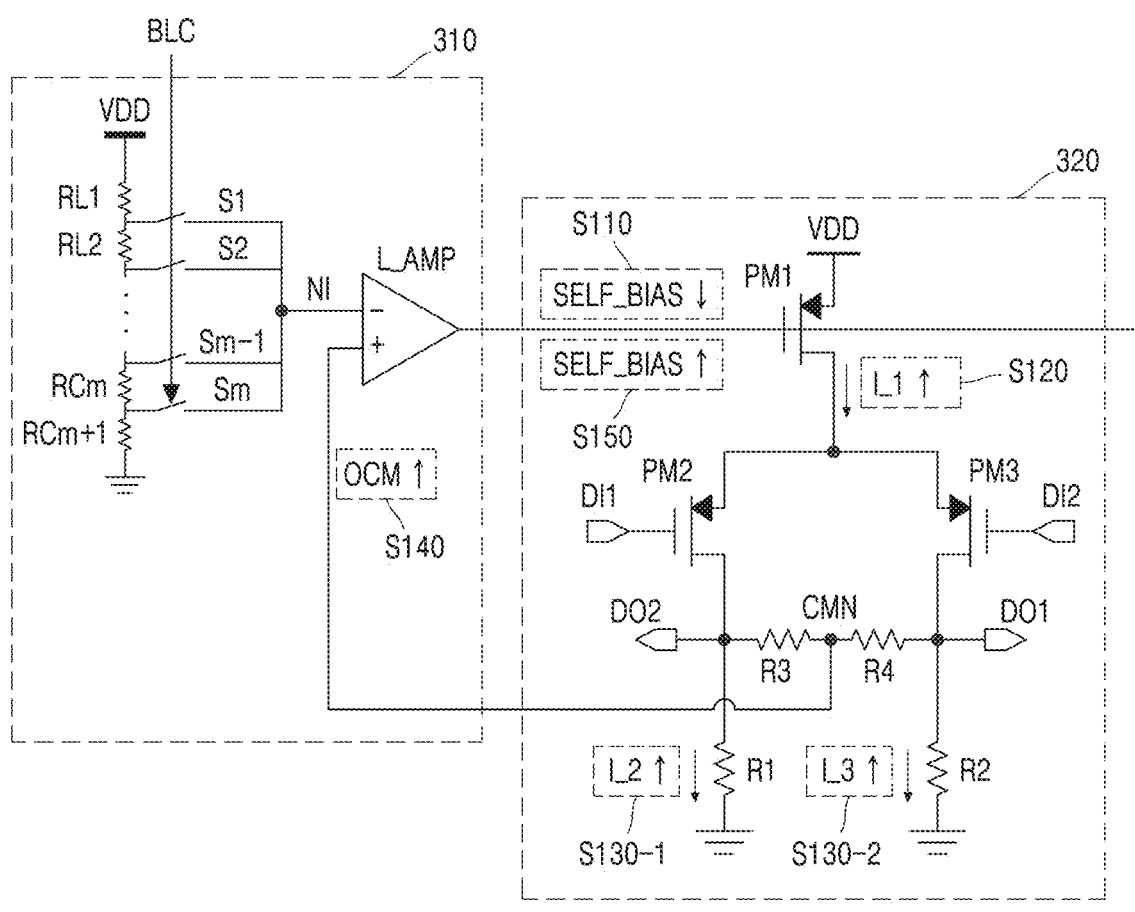
FIG. 4A is a diagram showing an operation of the self-bias signal according to an example embodiment.
Figure 4B:
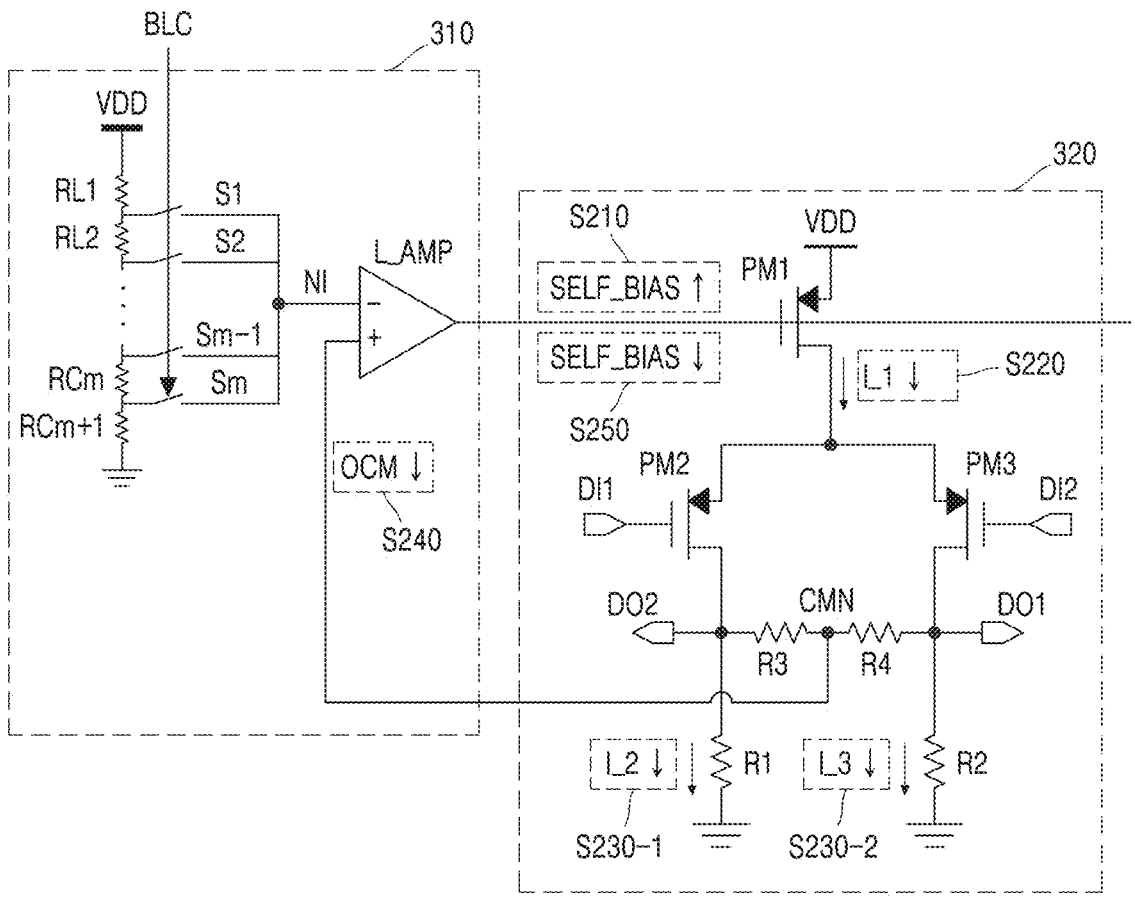
FIG. 4B is a diagram showing an operation of the self-bias signal according to an example embodiment.

FIG. 4A is a diagram showing an operation of the self-bias signal SELF-BIAS according to an example embodiment. FIGS. 4A and 4B may be diagrams for describing a negative feedback operation of the self-bias signal generating circuit 300. Referring to FIGS. 4A and 4B, the voltage level of the self-bias signal SELF-BIAS may be changed due to a factor like noise of a receiver. FIG. 4A may show a case in which the voltage level of the self-bias signal SELF-BIAS is lowered, and FIG. 4B may show a case in which the voltage level of the self-bias signal SELF-BIAS is increased. FIGS. 4A and 4B may be described with reference to FIG. 3.

The negative feedback operation of FIG. 4A may include operations S110 to S150.

In operation S110, the voltage level of the self-bias signal SELF-BIAS may be lowered. As described above, the voltage level of the self-bias signal SELF-BIAS may be lowered due to a factor like noise of a receiver. Therefore, the voltage level of the gate of the first PMOS transistor PM1 may be lowered.

In operation S120, the magnitude of the first current I_1 may increase. Since the voltage level of the gate of the first PMOS transistor PM1 may be lowered, the degree to which a channel of the first PMOS transistor PM1 is formed may increase. Therefore, the magnitude of the first current Ii flowing through the first PMOS transistor PM1 may increase.

In operation S130-1, the magnitude of the second current I_2 flowing through the first resistor R1 may increase. Since the sum of the magnitude of the second current I_2 and the magnitude of the third current I_3 may be equal or substantially equal to the magnitude of the first current I_1, when the magnitude of the first current Ii increases, the magnitude of the second current I_2 may also increase. Similarly, the magnitude of the third current I_3 flowing through the second resistor R2 may increase in operation S130-2.

In operation S140, the voltage level of the output common-mode signal OCM may increase. The voltage level of the second differential output signal DO2 may be R1*I_2 which is a value obtained by multiplying the magnitude of the first resistor R1 by the second current I_2, and the voltage level of the first differential output signal DO1 may be R2*I_3, which is a value obtained by multiplying the magnitude of the second resistor R2 by the third current I_3. When the third resistor R3 and the fourth resistor R4 have the same or substantially the same magnitude, the voltage level of the output common-mode signal OCM applied to the common-mode node CMN may be $$\frac{R1*I\_2 + R2*I\_3}{2},$$

which is the average of R1*I_2 and R2*I_3. Since the magnitude of the second current I_2 and the magnitude of the third current I_3 may increase in operation S130-1 and operation S130-2, respectively, the voltage level of the output common-mode signal OCM may increase in operation S140.

In operation S150, the voltage level of the self-bias signal SELF-BIAS may increase. When the voltage level of the negative input signal NI of the feedback loop circuit 310 is constant or substantially constant, the voltage level of the output common-mode signal OCM increases in operation S140, and thus a difference between the voltage level of the output common-mode signal OCM and the voltage level of the negative input signal NI may increase. Therefore, the voltage level of the self-bias signal SELF-BIAS, which is a signal obtained by amplifying the difference between the voltage level of the output common-mode signal OCM and the voltage level of the negative input signal NI, may increase.

Therefore, the self-bias signal generating circuit 300 may generate a stable self-bias signal SELF-BIAS by reducing the variation of the voltage level of the self-bias signal SELF-BIAS by performing the negative feedback operation of operations S110 to S150.

FIG. 4B is a diagram showing an operation of the self-bias signal SELF-BIAS according to an example embodiment. The negative feedback operation of FIG. 4B may include operations S210 to S250.

In operation S210, the voltage level of the self-bias signal SELF-BIAS may be increased. As described above, the voltage level of the self-bias signal SELF-BIAS may be increased due to a factor like noise of a receiver. Therefore, the voltage level of the gate of the first PMOS transistor PM1 may be increased.

In operation S220, the magnitude of the first current I_1 may decrease. Since the voltage level of the gate of the first PMOS transistor PM1 may be increased, the degree to which a channel of the first PMOS transistor PM1 is formed may decrease. Therefore, the magnitude of the first current Ii flowing through the first PMOS transistor PM1 may decrease.

In operation S230-1, the magnitude of the second current I_2 flowing through the first resistor R1 may decrease. Since the sum of the magnitude of the second current I_2 and the magnitude of the third current I_3 may be equal or substantially equal to the magnitude of the first current I_1, when the magnitude of the first current Ii decreases, the magnitude of the second current I_2 may also decrease. Similarly, the magnitude of the third current I_3 flowing through the second resistor R2 may decrease in operation S230-2.

In operation S240, the voltage level of the output common-mode signal OCM may decrease. The voltage level of the second differential output signal DO2 may be R1*I_2 which is a value obtained by multiplying the magnitude of the first resistor R1 by the second current I_2, and the voltage level of the first differential output signal DO1 may be R2*I_3, which is a value obtained by multiplying the magnitude of the second resistor R2 by the third current I_3. When the third resistor R3 and the fourth resistor R4 have the same or substantially the same magnitude, the voltage level of the output common-mode signal OCM applied to the common-mode node CMN may be $$\frac{R1 * I\_2 + R2 * I\_3}{2},$$

which is the average of R1*I_2 and R2*I_3. Since the magnitude of the second current I_2 and the magnitude of the third current I_3 may decrease in operation S230-1 and operation S230-2, respectively, the voltage level of the output common-mode signal OCM may decrease in operation S240.

In operation S250, the voltage level of the self-bias signal SELF-BIAS may decrease. When the voltage level of the negative input signal NI of the feedback loop circuit 310 is constant or substantially constant, the voltage level of the output common-mode signal OCM decreases in operation S240, and thus a difference between the voltage level of the output common-mode signal OCM and the voltage level of the negative input signal NI may decrease. Therefore, the voltage level of the self-bias signal SELF-BIAS, which is a signal obtained by amplifying the difference between the voltage level of the output common-mode signal OCM and the voltage level of the negative input signal NI, may decrease. Therefore, the self-bias signal generating circuit 300 may generate a stable self-bias signal SELF-BIAS by reducing the variation of the voltage level of the self-bias signal SELF-BIAS by performing the negative feedback operation of operations S210 to S250.

Figure 5:
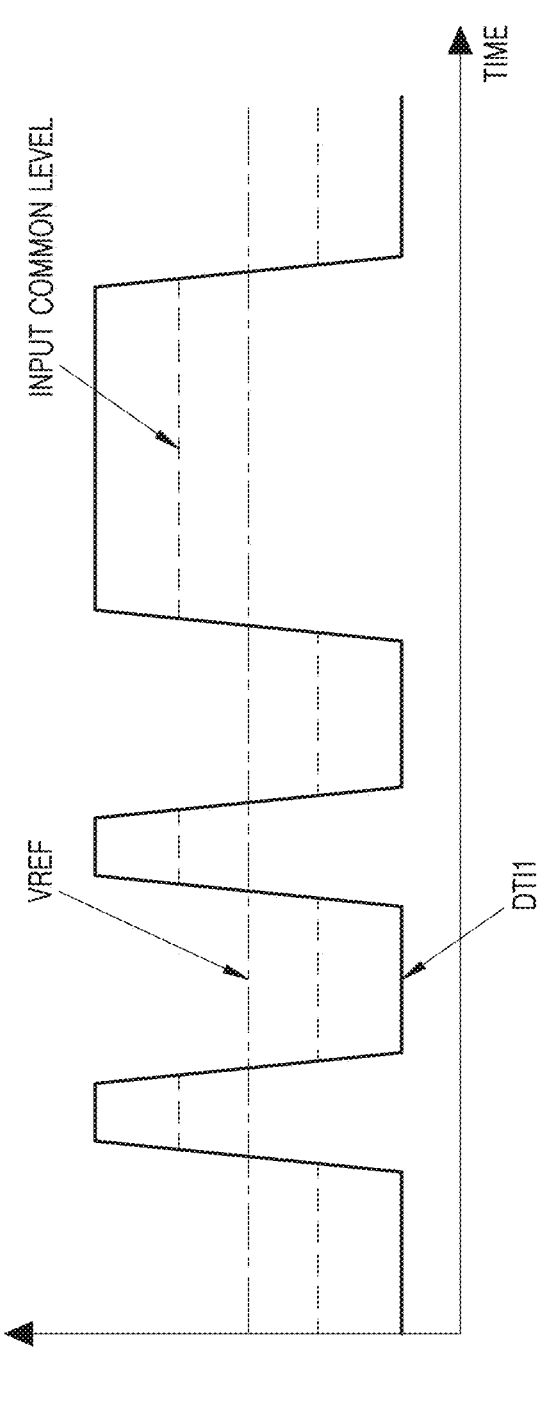
FIG. 5 is a waveform diagram showing a voltage level of a data lane according to an example embodiment.

FIG. 5 is a waveform diagram showing a voltage level of a data lane according to an example embodiment.

FIG. 5 shows voltage levels of the first input data signal DTI1, the reference voltage signal VREF, and the input common-mode signal over time.

The first input data signal DTI1 of FIG. 5 may be a signal IN1 applied to the first input terminal of FIG. 2 or the first input data signal DTI1 applied to the first input terminal of the data lane amplifier circuit 400 of FIG. 3.

The reference voltage signal VREF of FIG. 5 may be a signal IN2 applied to the second input terminal of FIG. 2 or a signal DTI2 applied to the second input terminal of the data lane amplifier circuit 400 of FIG. 3.

As shown in FIG. 5, the voltage level of the first input data signal DTI1 may change randomly over time, and the reference voltage signal VREF may have a constant or substantially constant voltage level. An input common-mode signal may have a voltage level corresponding to an average value of the voltage level of the first input data signal DTI1 and the voltage level of the reference voltage signal VREF. Since the voltage level of the first input data signal DTI1 may randomly change over time, the voltage level of the input common-mode signal may also randomly change over time.

As described above with reference to FIG. 2, when the voltage level of the input common-mode signal is not constant, the voltage level of the output common-mode signal OCM may not be constant. Therefore, the voltage level of the self-bias signal SELF-BIAS generated by using the output common-mode signal OCM may not be constant.

FIG. 6 is a waveform diagram showing voltage levels of differential input signals according to an example embodiment. FIG. 6 shows voltage levels of the first differential input signal DI1, the second differential input signal DI2, and the input common-mode signal over time.

The first differential input signal DI1 of FIG. 6 may be the signal IN1 applied to the first input terminal of FIG. 2 or the first differential input signal DI1 applied to the first input terminal of the differential amplifier circuit 320 of FIG. 3.

The second differential input signal DI2 of FIG. 6 may be the signal IN2 applied to the second input terminal of FIG. 2 or the signal DI2 applied to the second input terminal of the differential amplifier circuit 320 of FIG. 3.

As shown in FIG. 6, the first differential input signal DI1 and the second differential input signal DI2 may change complementary to each other, and the sum of the first differential input signal DI1 and the second differential input signal DI2 may be constant. Therefore, the input common-mode signal having an average value of the voltage level of the first differential input signal DI1 and the voltage level of the second differential input signal DI2 may have a constant or substantially constant voltage level.

As described above with reference to FIG. 3, when the voltage level of the input common-mode signal is constant or substantially constant, the voltage level of the output common-mode signal OCM may be constant or substantially constant. Therefore, the voltage level of the self-bias signal SELF-BIAS generated by using the output common-mode signal OCM may be constant or substantially constant.

Figure 7A:
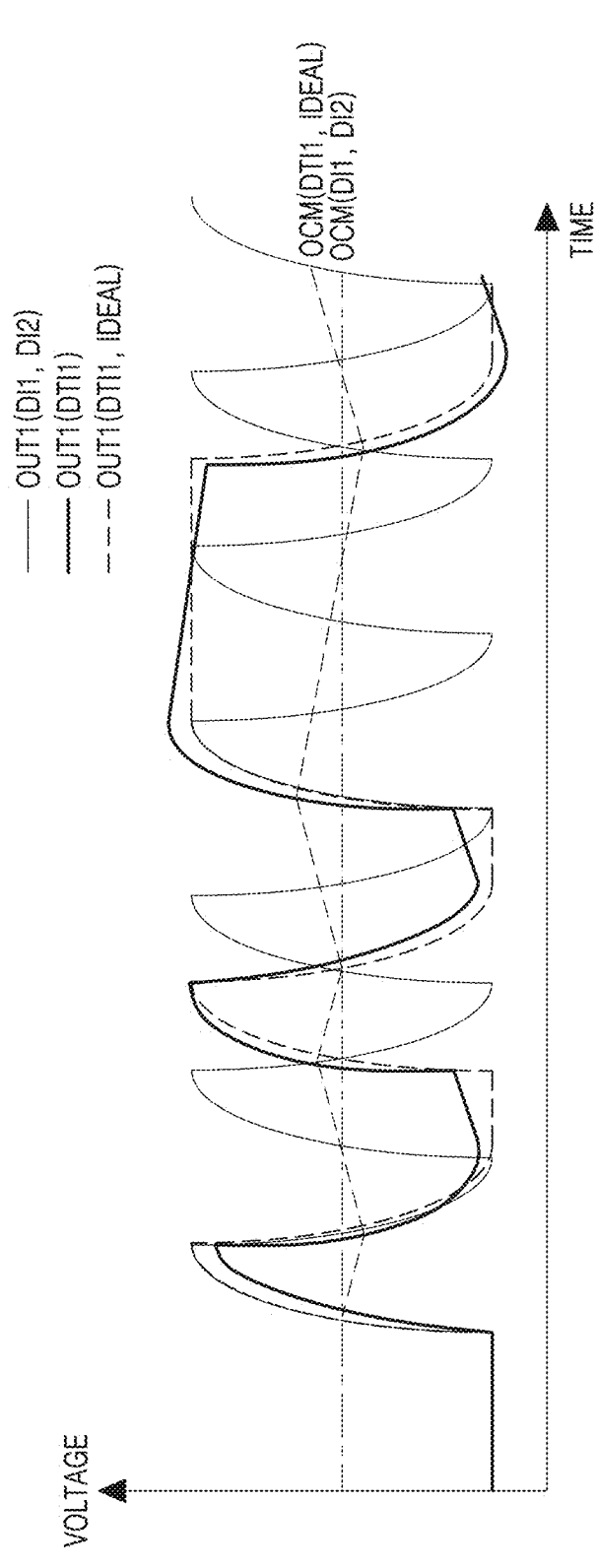
FIG. 7A is a waveform diagram showing a voltage level of a self-bias signal generating circuit according to a comparative example embodiment.

FIG. 7A is a waveform diagram showing a voltage level of a self-bias signal generating circuit according to a comparative example embodiment. FIG. 7A may be described with reference to FIG. 2.

Referring to FIG. 7A, when the self-bias signal generating circuit 200 receives the first differential input signal DI1 and the second differential input signal DI2, the first output signal OUT1 and the output common-mode signal OCM is shown, and, when the self-bias signal generating circuit 200 receives the first input data signal DTI1, the first output signal OUT1 and the output common-mode signal OCM are shown.

The signal waveforms shown in FIG. 7A are shown on the assumption that the self-bias signal generating circuit 200 of FIG. 2 has ideal first to third PMOS transistors PM1 to PM3. However, for reference, the first output signal OUT1 when the self-bias signal generating circuit 200 that does not have an ideal PMOS transistor receives the first input data signal DTI1 is also shown.

When the self-bias signal generating circuit 200 receives the first differential input signal DI1 and the second differential input signal DI2, the voltage level of the output common-mode signal OCM may be constant or substantially constant. On the other hand, when the self-bias signal generating circuit 200 receives the first input data signal DTI1, the voltage level of the output common-mode signal OCM may randomly change according to the first input data signal DTI1.

Figure 7B:
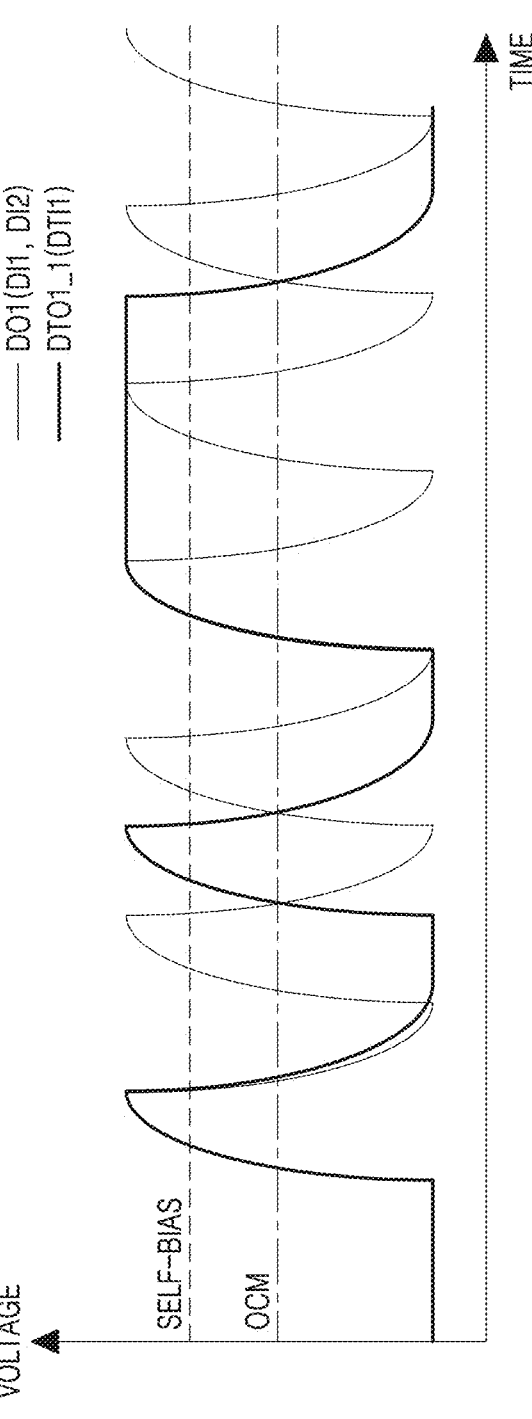
FIG. 7B is a waveform diagram showing a voltage level of a self-bias signal generating circuit according to an example embodiment.

FIG. 7B is a waveform diagram showing a voltage level of a self-bias signal generating circuit according to an example embodiment. FIG. 7B may be described with reference to the self-bias signal generating circuit 300 of FIG. 3.

Referring to FIG. 7B, the first differential output signal DO1 and the output common-mode signal OCM generated by the differential amplifier circuit 320 of the self-bias signal generating circuit 300 based on the first differential input signal DI1 and the second differential input signal DI2 are shown, and the self-bias signal SELF-BIAS generated by the feedback loop circuit 310 based on the output common-mode signal OCM is shown. Also, the output data signal 1_1 DTO1_1 generated by the data lane amplifier circuit 400 of the self-bias signal generating circuit 300 based on the first input data signal DTI1 is shown.

FIG. 8 is a block diagram showing a receiver according to an example embodiment. A receiver 500 may include a clock lane circuit 510 and first to N-th data lane circuits 520_1 to 520_N.

Referring to FIG. 8, the receiver 500 may be a source synchronous interface receiver. In other words, the clock input signals CLOCK1 and CLOCK2 applied to the clock lane circuit 510 and first to N-th input data signals DTI1 to DTIN applied to the first to N-th data lane amplifier circuits 520_1 to 520_N may be simultaneously or substantially simultaneously transmitted in parallel. The clock input signals CLOCK1 and CLOCK2 of FIG. 8 may correspond to the first and second differential input signals DI1 and DI2 described above with reference to FIG. 3.

The clock lane circuit 510 may generate a digital clock output signal CLK based on a first clock input signal CLOCK1 and a second clock input signal CLOCK2, which are analog signals.

The clock lane circuit 510 may include the self-bias signal generating circuit 511. The self-bias signal generating circuit 511 may correspond to the self-bias signal generating circuit 300 described above with reference to FIG. 3. In other words, the self-bias signal generating circuit 511 may generate the output common-mode signal OCM based on the first clock input signal CLOCK1 and the second clock input signal CLOCK2, which are analog signals, and generate the self-bias signal SELF-BIAS by adjusting the voltage level of the output common-mode signal OCM. Also, the self-bias signal SELF-BIAS may have a constant or substantially constant voltage level.

As shown in FIG. 3, the self-bias signal generating circuit 511 may adjust the voltage level of the self-bias signal SELF-BIAS based on the bias level control signal BLC received from a controller (not shown) of a receiver.

As shown in FIG. 3, the self-bias signal generating circuit 511 may include a current source transistor (e.g., PM1 of FIG. 3), wherein the self-bias signal SELF-BIAS is applied to a gate terminal of the current source transistor.

The first to N-th data lane circuits 520_1 to 520_N may receive the self-bias signal SELF-BIAS from the self-bias signal generating circuit 511 of the clock lane circuit 510 and use the self-bias signal SELF-BIAS to amplify the input data signals DTI1 to DTIN.

The first to N-th data lane circuits 520_1 to 520_N may generate first to N-th digital data output signals D[1] to D[N] by receiving and sampling the first to N-th input data signals DTI1 to DTIN, which are analog signals, respectively.

Figure 9:
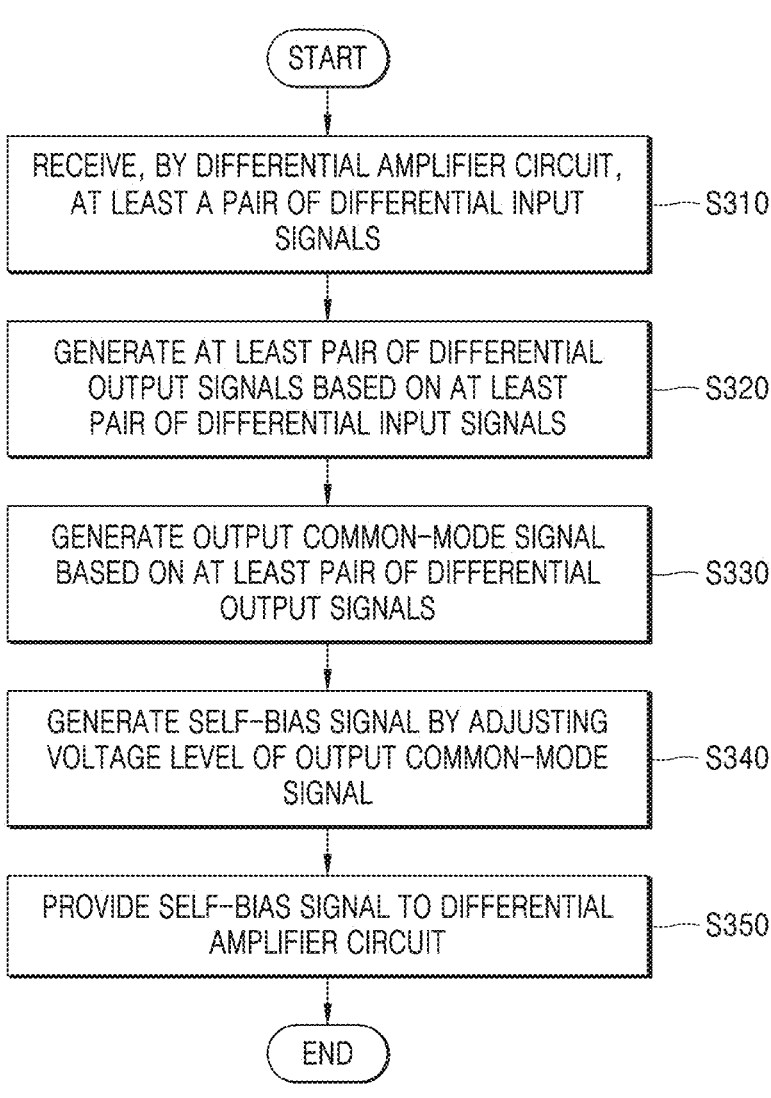
FIG. 9 is a flowchart of a method of generating a self-bias signal according to an example embodiment.

FIG. 9 is a flowchart of a method of generating a self-bias signal according to an example embodiment. FIG. 9 may be described with reference to FIGS. 3 and 8.

The method of generating a self-bias signal may include operations S310 to S350.

In operation S310, at least a pair of differential input signals DI1 and DI2 may be received by the differential amplifier circuit 320. For example, referring to FIG. 3, the differential amplifier circuit 320 may receive the first differential input signal DI1 and the second differential input signal DI2. Also, as shown in FIG. 8, the at least a pair of differential input signals may be at least a pair of clock input signals CLOCK1 and CLOCK2.

In operation S320, at least a pair of differential output signals DO1 and DO2 may be generated by amplifying at least a pair of differential input signals DI1 and DI2. For example, the differential amplifier circuit 320 may generate the first differential output signal DO1 and the second differential output signal DO2 by amplifying the first differential input signal DI1 and the second differential input signal DI2, respectively.

In operation S330, the output common-mode signal OCM may be generated based on the at least a pair of differential output signals DO1 and DO2. For example, the differential amplifier circuit 320 may generate the output common-mode signal OCM based on the first differential output signal DO1 and the second differential output signal DO2.

In operation S340, the self-bias signal SELF-BIAS may be generated by adjusting the voltage level of the output common-mode signal OCM. For example, the feedback loop circuit 310 may generate the self-bias signal SELF-BIAS by amplifying a difference between the voltage level of the output common-mode signal OCM and the voltage level of the negative input signal NI. As described above, since the output common-mode signal OCM may have a constant or substantially constant voltage level, the self-bias signal SELF-BIAS may have a constant or substantially constant voltage level. Also, the voltage level of the self-bias signal SELF-BIAS may be adjusted based on the bias level control signal BLC. For example, the feedback loop circuit 310 may adjust the voltage level of the self-bias signal SELF-BIAS by adjusting turn-on/turn-off of the first to m-th switches S1 to Sm based on the bias level control signal BLC.

In operation S350, the self-bias signal SELF-BIAS may be provided to the differential amplifier circuit 320. For example, the feedback loop circuit 310 may provide the self-bias signal SELF-BIAS generated in operation S340 to the differential amplifier circuit 320. Also, operation S350 may include an operation of providing the self-bias signal SELF-BIAS to at least one data lane.

Figure 10:
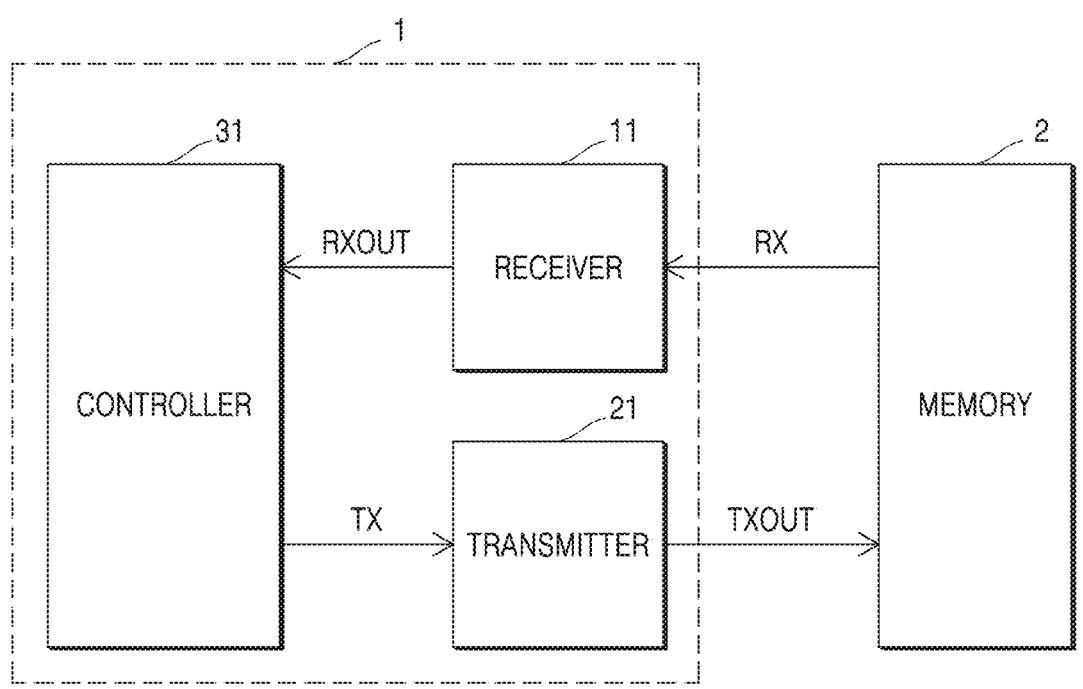
FIG. 10 is a block diagram showing an apparatus according to an example embodiment.

FIG. 10 is a block diagram showing an apparatus according to an example embodiment.

The apparatus according to an example embodiment may be an application processor 1 including a receiver 11, a transmitter 21, and a controller 31. Also, the apparatus according to an embodiment may include the application processor 1 and a memory 2.

As the receiver 11, the receiver described with reference to FIG. 8 may be used. The receiver 11 may receive a reception signal RX input from another external device, e.g., the memory 2, and output a reception output signal RXOUT.

For example, the receiver 11 may receive the first clock input signal CLOCK1 and the second clock input signal CLOCK2, which are analog signals, and the first to N-th input data signals DTI1 to DTIN from the memory 2 and generate the digital clock output signal CLK and the first to N-th digital data output signals D[1] to D[N].

The transmitter 21 may receive a transmission signal TX input from the controller 31 and output a transmission output signal TXOUT.

The reception signal RX and/or the transmission output signal TXOUT may be data or other control signals.

The controller 31 may receive the reception output signal RXOUT and use the reception output signal RXOUT to perform a certain operation, e.g., an arbitrary calculation operation or an arbitrary display operation. Also, the controller 31 may output data that needs to be stored in a device like the memory 2 or a control signal for controlling the memory 2 and other devices as the transmission signal TX.

The memory 2 may output stored data as the reception signal RX and may perform an operation like storing data by inputting the transmission output signal TXOUT.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

While some example embodiments of the inventive concept have been particularly shown and described, it will be understood that various changes in form and details may be made therein without departing from scope of the inventive concepts.

What is claimed is:

1. A self-bias signal generating circuit comprising:
a differential amplifier circuit including a current source transistor, the differential amplifier circuit configured to amplify at least a pair of differential input signals to generate at least a pair of differential output signals, and the differential amplifier circuit configured to generate an output common-mode signal based on the at least a pair of differential output signals; and
a feedback loop circuit configured to adjust a voltage level of the output common-mode signal to generate a self-bias signal, and the feedback loop circuit configured to provide the self-bias signal to the differential amplifier circuit,
wherein the self-bias signal is applied to a gate terminal of the current source transistor, and
wherein the feedback loop circuit is configured to provide the self-bias signal to at least one data lane.

2. The self-bias signal generating circuit of claim 1, wherein the differential amplifier circuit is configured to generate the output common-mode signal to offset a change of the voltage level of the self-bias signal.

3. The self-bias signal generating circuit of claim 1, wherein the feedback loop circuit is configured to adjust the voltage level of the self-bias signal based on a bias level control signal.

4. The self-bias signal generating circuit of claim 1, wherein the at least a pair of differential input signals comprises at least a pair of clock input signals.

5. The self-bias signal generating circuit of claim 1, wherein the self-bias signal has a constant voltage level.

6. The self-bias signal generating circuit of claim 1, wherein the differential amplifier circuit further comprises:
a third resistor having a first end and a second end, wherein the first end is connected to a second output terminal of the differential amplifier circuit, and the second end is connected to a positive input terminal of the feedback loop circuit; and
a fourth resistor having a first end and a second end, wherein the first end of the fourth resistor is connected to the second end of the third resistor, and the second end of the fourth resistor is connected to a first output end of the differential amplifier circuit.

7. The self-bias signal generating circuit of claim 6, wherein the output common-mode signal has a voltage level between a voltage level of a first voltage applied to the first end of the third resistor and a voltage level of a second voltage applied to the second end of the fourth resistor.

8. The self-bias signal generating circuit of claim 1, wherein the current source transistor is a first PMOS transistor having a source connected to a power terminal, and the differential amplifier circuit further comprises:
a second PMOS transistor having a source and a gate, wherein the source of the second PMOS transistor is connected to a drain of the first PMOS transistor, and the gate is configured to receive one of the at least a pair of differential input signals; and
a first resistor connected between a drain of the second PMOS transistor and a ground terminal.

9. The self-bias signal generating circuit of claim 8, further comprising:
a third PMOS transistor having a source and a gate, wherein the source of the third PMOS transistor is connected to the drain of the first PMOS transistor, and the gate of the third PMOS transistor is configured to receive a signal paired with a signal applied to a gate of the second PMOS transistor; and
a second resistor connected between a drain of the third PMOS transistor and the ground terminal.

10. A receiver comprising:
a differential lane circuit including a self-bias signal generating circuit, the differential lane circuit configured to generate a digital differential output signal based on at least a pair of analog differential input signals; and
at least one data lane circuit configured to generate a digital data output signal by sampling an analog data input signal,
wherein the self-bias signal generating circuit is configured to generate an output common-mode signal based on the at least a pair of analog differential input signals, generate a self-bias signal by adjusting a voltage level of the output common-mode signal, and provide the self-bias signal to the at least one data lane circuit.

11. The receiver of claim 10, wherein the self-bias signal generating circuit is further configured to adjust the voltage level of the self-bias signal based on a bias level control signal.

12. The receiver of claim 10, wherein the at least a pair of analog differential input signals comprises at least a pair of clock input signals.

13. The receiver of claim 10, wherein the self-bias signal has a constant voltage level.

14. The receiver of claim 10, wherein the differential lane circuit comprises a current source transistor, and the self-bias signal is applied to a gate terminal of the current source transistor.

15. A method of generating a self-bias signal, the method comprising:
receiving, by a differential amplifier circuit, at least a pair of differential input signals;
generating at least a pair of differential output signals by amplifying the at least a pair of differential input signals;
generating an output common-mode signal based on the at least a pair of differential output signals;
generating the self-bias signal by adjusting a voltage level of the output common-mode signal; and
providing the self-bias signal to the differential amplifier circuit,

wherein providing the self-bias signal to the differential amplifier circuit comprises providing the self-bias signal to at least one data lane.

16. The method of claim 15, wherein, in the generating of the self-bias signal by adjusting a voltage level of the output common-mode signal, the voltage level of the self-bias signal is adjusted based on a bias level control signal.

17. The method of claim 15, wherein the at least a pair of differential input signals comprises at least a pair of clock input signals.

18. The method of claim 15, wherein the self-bias signal has a constant voltage level.

19. The self-bias signal generating circuit of claim 1, wherein the at least a pair of differential input signals comprises at least a pair of clock input signals that are applied to at least one clock lane.

20. The method of claim 15, wherein the at least a pair of differential input signals comprises at least a pair of clock input signals that are applied to at least one clock lane.

* * * * *